United States Patent [19]

Sill

[11] 4,199,376
[45] Apr. 22, 1980

[54] LUMINESCENT SOLAR COLLECTOR

[75] Inventor: Richard C. Sill, Reno, Nev.

[73] Assignee: Atlantic Richfield Company, Los Angeles, Calif.

[21] Appl. No.: 958,226

[22] Filed: Nov. 6, 1978

[51] Int. Cl.² ............................................. H01L 31/04
[52] U.S. Cl. ............................ 136/89 FC; 136/89 CA
[58] Field of Search ......... 136/89 FC, 89 CL, 89 CA

[56] References Cited
U.S. PATENT DOCUMENTS

| | | | |
|---|---|---|---|
| 2,904,612 | 9/1959 | Regnier | 136/89 |
| 4,110,123 | 8/1978 | Goetzberger et al. | 136/89 HY |
| 4,116,718 | 9/1978 | Yerkes et al. | 136/89 PC |
| 4,130,445 | 12/1978 | Blieden | 136/89 PC |

*Primary Examiner*—Aaron Weisstuch
*Attorney, Agent, or Firm*—Robert M. Betz

[57] ABSTRACT

A luminescent sheet having two essentially parallel opposed large area surfaces separated by one or more thin edge faces, the sheet being penetrated by one or more tapered, asymmetrically disposed cavities extending from one such surface at least partially through such sheet toward the opposite surface and a corresponding number of photovoltaic cells positioned on such opposite surface in respective concentric alignment with such cavities so that light internally reflected from the convergent side walls of such cavities toward such opposite surface is concentrated onto such cells.

16 Claims, 10 Drawing Figures

LUMINESCENT SOLAR COLLECTOR

BACKGROUND OF THE INVENTION

1. Field of the Invention

This invention relates generally to apparatus for converting solar energy to electricity by means of solar cells and more particularly to apparatus of this type which more efficiently collects and concentrates available sunlight for utilization by such cells.

2. Description of the Prior Art

It is well known that specially prepared semi-conductor p-n junctions known as photovoltaic cells can convert energy from sunlight to electricity. It is also known that such cells can convert to electricity only that portion of the incident photon energy spectrum, typically solar radiation, which creates hole-electron pairs within a given semi-conductor material. Photons having less energy than the desired spectrum are not absorbed at all, while more energetic photons are strongly absorbed and wasted in heating the cell which further degrades its energy conversion efficiency. Thus, it is advantageous to convert as much of the available light as possible into an energy spectrum to which a photovoltaic cell can usefully respond before the light strikes the cell's surface.

An existing technique for achieving the energy conversion alluded to above takes advantage of the fact that light falling on a luminescent material or agent is characteristically reradiated or emitted in such a fashion as to approach a narrow band of wavelengths of known energy content. Also light absorbed by such a material in one direction is scattered in many other directions. Materials or agents for this purpose include, for example, organic dyes used in scintillation counters, lasers, and the like. For the purpose of this application, the term "luminescent agent" is understood to include materials exhibiting all species of luminescence, including but not limited to fluorescence and phosphorescence.

It is shown in the literature that a dispersal of such luminescent materials within an internally reflective sheet or layer of transparent glass or plastic, one of whose major sides or surfaces is exposed to the sun, concentrates and focuses a flux of light of known energy level, by successive reflections, toward one or more of the upstanding edge faces of such sheet. If a photovoltaic cell responsive only to light as that known energy level is placed against or optically coupled to one such edge face, the energy conversion efficiency of the cell is increased several fold. In the present application, a light transmissive sheet of such construction and properties is termed a "luminescent sheet" and a photovolatic solar collector employing such a sheet may be termed a "luminescent solar collector". A luminescent solar collector of this type is fully and completely disclosed in *Applied Optics*, Volume 15, No. 10, Pages 2299-2300, dated October 1976, the disclosure of which is incorporated by reference.

While a thin luminescent sheet of the type described produces a high multiplication of incident light intensity on an edge mounted solar cell, such an arrangement is impractical for solar cells of conventional design and size.

SUMMARY OF THE INVENTION

It is therefore a general object of this invention to provide a new and improved photovoltaic solar collector employing a luminescent sheet.

It is a more specific object of this invention to provide a new and improved photovoltaic solar collector which employs a thin luminescent sheet whose surface is modified so as to utilize the light concentration characteristics of such sheet in a more practical manner.

In accordance with this invention, a luminescent sheet is at least partially penetrated by one or more tapered cavities extending inwardly from one of its two essentially parallel, opposed large area surfaces toward the other, such surfaces being separated by thin edge faces. A corresponding number of photovoltaic cells are positioned on such other surface in alignment with such cavities, the convergent annular side walls of such cavities being contoured so as to provide for total internal reflection of light energy directed toward such cells.

Other objects and advantages of this invention will become apparent from a consideration of the detailed description to follow, taken in conjunction with the figures and the appended claims.

DESCRIPTION OF THE PREFERRED EMBODIMENTS

Figure 1:
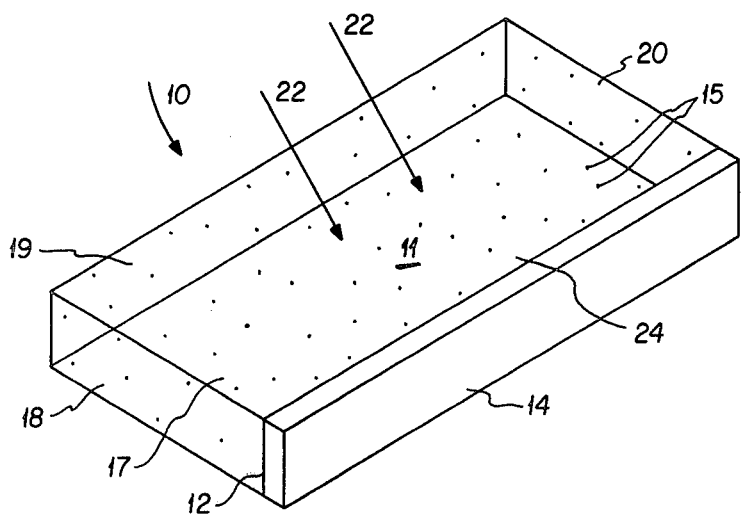
FIG. 1 shows a prior art luminescent solar collector.
Figure 2:
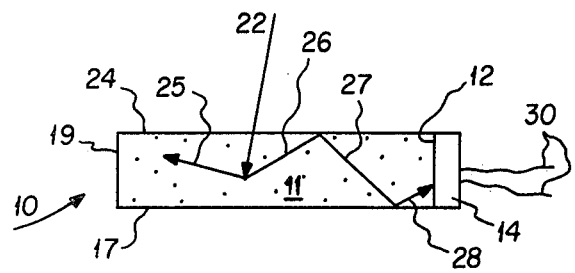
FIG. 2 shows a cross-section of the device of FIG. 1.

FIGS. 1 and 2 show a prior art luminescent solar collector 10 consisting of a planar luminescent sheet 11, one upstanding edge face 12 which is substantially covered by a solar cell 14. Sheet 11 is composed of a matrix material impregnated with one or more luminescent agents represented diagrammatically by dots 15. The bottom surface 17 and the remaining three upstanding edge faces 18, 19, and 20 may be mirrored for high reflectance.

In accordance with the prior art teachings, a ray of sunlight represented by any of arrows 22 impinges on the transparent, polished upper surface 24 and passes into the interior of the luminescent sheet 11. When the ray 22 impacts a luminescent agent 15, it is partially absorbed and re-emitted in a narrow wavelength band efficiently usable by the photovoltaic cell 14. This re-emitted light is scattered in many directions, exemplified by subrays 25 and 26 in FIG. 2, which increases the probability of internal reflection. By means of successive reflections of these re-emitted subrays, such as exemplified by subrays 27 and 28, it has been established that an intense flux of light at the desired wavelength is funneled to the edge 12 where it impinges on the photo-cell 14 and stimulates the desired energy conversion. The electricity generated can be coupled into a useful load by means of conductors 30.

In order to attach a photovoltaic cell of conventional design and size to the edge face 12, the edge faces 12, 18, 19, and 20 of luminescent sheet 11 must be made relatively thick with respect to the area of large area surfaces 17 and 24. This of course directly increases the cost of sheet 11 per unit area. Furthermore, for a large area luminescent sheet 11, subrays such as 25 through 28 will have to traverse so much of the body of sheet 11 in order to reach cell 14 that a substantial part of the light in the desired energy spectrum will be absorbed prior to reaching cell 14. The invention to be described makes it possible to employ a relatively thin luminescent sheet by modifying the sheet itself and repositioning the associated photovoltaic cells.

Figure 3:
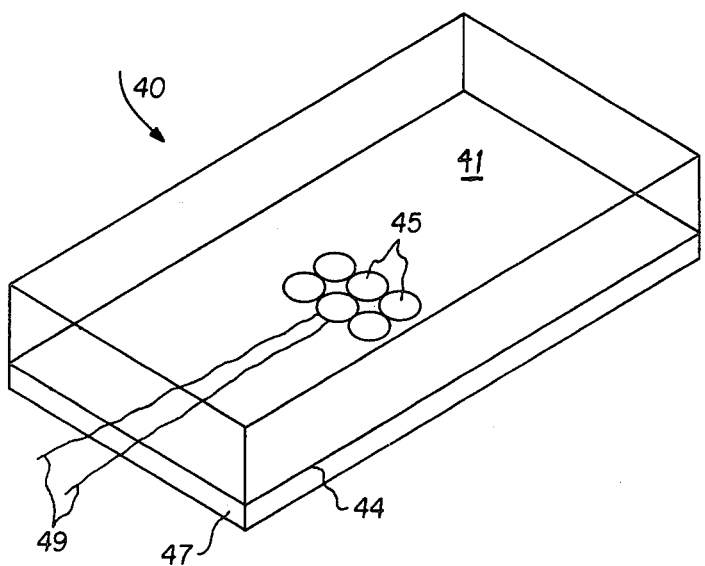
FIG. 3 shows a prior art photovoltaic device.

FIG. 3 shows a conventional superstrate prior art photovoltaic solar collector 40 which does not employ luminescent enhancement. The device consists of an upper light transmitting member 41 of transparent material which may be polymeric or glass or similar material and which may carry on its underside 44 a plurality of photovoltaic cells 45 having a moisture barrier layer 47 thereunder which may be also composed of transparent material. Electrical leads 49 may be interconnected with cells 45 as shown. A device such as shown in FIG. 3 does not suffer from the disadvantage of the prior art device of FIG. 1 in that adequate space is now provided for photovoltaic cells 45 of any desired size. However, such a device lacks the edge-directed light concentration characteristics of a luminescent sheet. The present invention combines the practical advantage of mounting photovoltaic cells on a large area surface of a transparent superstrate with the light concentration ability of a luminescent sheet by providing the sheet with interior optical surfaces which effectively concentrate and focus light energy toward such cells.

Figure 4:
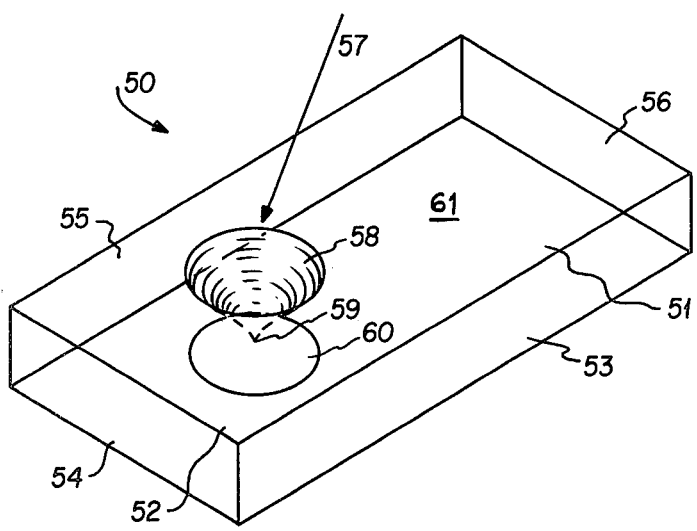
FIG. 4 is a device in accordance with the preferred embodiment of this invention.
Figure 5:
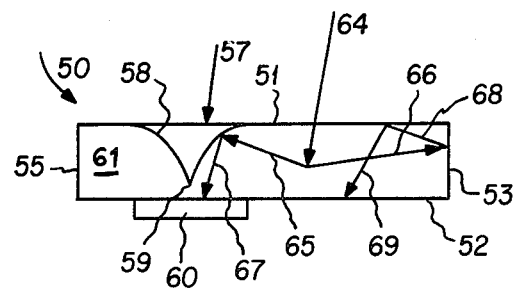
FIG. 5 is a cross-section of the device of FIG. 4.

Referring now to FIGS. 4 and 5, there is shown a luminescent solar collector 50 in accordance with this invention. In these and subsequent figures illustrating luminescent sheets the representation of internal luminescent agents has been omitted for clarity. A luminescent sheet 61 includes a pair of opposed essentially parallel large area surfaces 51 and 52 joined by thin upstanding edge faces 53, 54, 55 and 56, the cross-sectional area of sides 53 through 56 being small relative to the area of sides 51 and 52. Within the scope of this invention the sheet 61 in plan may assume any other desired outline, such as circular, hexagonal, etc.

The luminescent sheet 61 is provided with one or more tapered cavities 57 penetrating the upper surface 51 and extending at least partially through the thickness of sheet 61 toward the lower surface 52. As shown in FIGS. 4 and 5, cavity 57 preferably defines a surface of revolution whose optically smooth annular side wall 58 tapers and converges to apex 59. Coupled to the surface 52 is a corresponding photovoltaic cell 60 positioned in general alignment with the axis of cavity 57 so that the energy-receiving surface of the cell 60 faces and lies directly beneath the smoothly contoured side wall 58 of cavity 57.

As best seen in FIG. 5, a ray of sunlight 64 incident on sheet 61 penetrates the surface 51 and impinges on luminescent material therein so as to be re-emitted, for example, in the form of subrays 65 and 66. Subray 65, upon reaching the contoured surface 58, is reflected as subray 67 directly to the surface of the cell 60 without further energy absorbing internal reflections within the sheet 61. If edge faces 53 through 56 are made suitably reflective, the energy of subray 66 is redirected and retained within the sheet 61 as by subrays 68 and 69 until ultimately such redirected energy also reaches internally reflective side wall 58. In the manner described, there will be a concentration of light energy toward the downwardly convergent wall 58 on all sides substantially paralleling the surfaces 51 and 52. By positioning a cell 60 directly in the path of light energy internally reflected from the wall 58, the cell 60 becomes preferentially responsive to such reflected energy and receives an intensely concentrated light flux. Thus the cavity 57 may be said to act as a "light sink" or trap for sunlight incident over the surface 51. The introduction of cavity 57 is now seen in effect to take direct advantage of the edge concentration effect in a luminescent sheet while permitting the energy receiving photo voltaic cell 60 to be positioned on the conveniently large area surface 52.

Figure 6:
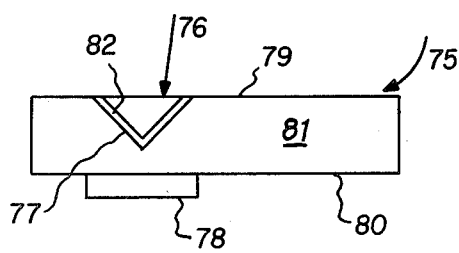
FIG. 6 is a device in accordance with an alternate embodiment of this invention.

The shape of the plane curve of wall 58 which generates the total surface thereof and which is defined by a vertical section through sheet 61 may be varied by the designer as a matter of choice depending on the desired distribution of reflected energy reaching cell 68. For example, in FIGS. 4 and 5 this curve may take the form of a downwardly concave generator such as a parabola or hyperbola. With a continuously varying slope for wall 58 reflection therefrom of light paralleling surfaces 51 and 52 will be distributed over an area of cell 60 with varying intensity. If desired, one may apply external reflective means (not shown) to wall 58, but within the skill of this art one may curve wall 58 so that it produces substantially total internal light reflection within the sheet 61 without such external reflective means. Conversely, as in the embodiment of FIG. 6, one may provide a luminescent collector 75 comprising luminescent sheet 81 with a cavity 76 having a side wall 77 formed from a straight line generator so as to produce a cone. In this case, energy internally reflected from such wall 77 tends to distribute itself uniformly over the area of photovoltaic cell 78. However, for efficient internal reflection wall 77 should not exceed an angle of 45° to the plane of surfaces 79 and 80 and should be provided with external silvering 82 or other reflective means.

Figure 7:
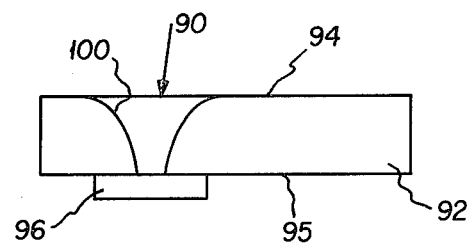
FIG. 7 is a device in accordance with a further alternate embodiment of this invention.

As shown in the additional alternate embodiment of this invention in FIG. 7, the cavity 90 in a luminescent sheet 92 may penetrate completely through from the upper sun light receiving surface 94 to the lower surface 95 on which is carried photovoltaic cell 96. As indicated above, the side wall 100 of cavity 90 may be given any desired downwardly concave or other shape. The mechanism of direct light energy reflection from the internal surface of wall 100 to cell 96 is the same as previously described, except that no reflected energy reaches the central portion of the cell 96.

In a practical device in accordance with this invention, it will be advantageous to degrade strict adherence to a perfectly square or other geometric shape for the luminescent sheet and to avoid symmetric placement of its internally reflective cavity. Thus, for example, in FIG. 4, one may cut faces 53 through 56 at other than ninety degree angles and offset cavity 57 toward one edge face 55. This will tend to minimize standing modes or repetitive edge-to-edge light reflections which miss the cavity 57, producing heat but no useful energy output.

Figure 8:
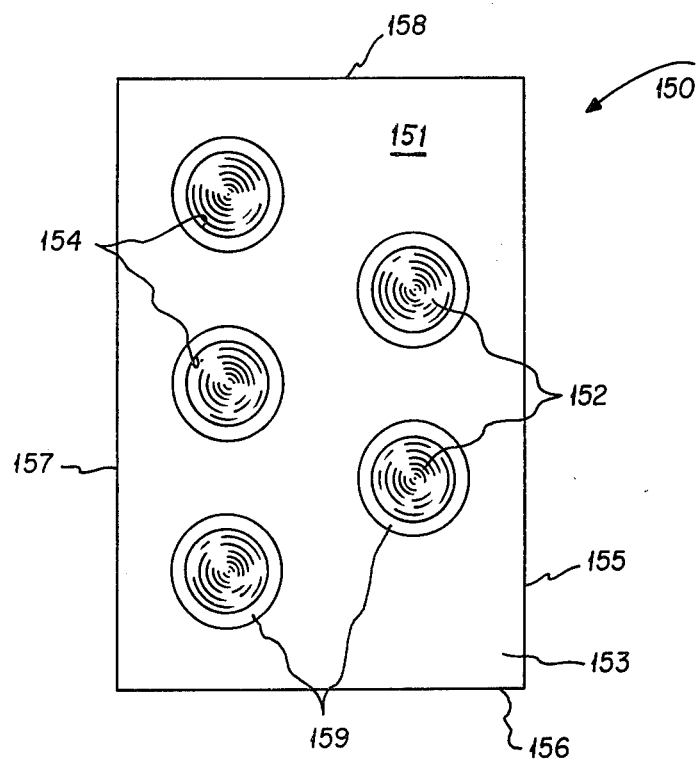
FIG. 8 is a device in accordance with a still further embodiment of this invention.

In the alternate embodiment of FIG. 8, a luminescent collector 150 comprising luminescent sheet 151 is shown in plan with an array of tapered cavities 152 extending downwardly from upper surface 153. It will be understood that a corresponding array of photovoltaic cells 159 may be disposed in one-to-one correspondence and alignment with the cavities 152 on the bottom surface (not shown) of the sheet 151. The mechanism of internal reflection from the respective side walls 154 of cavities 152 is identical to that previously described. The plan view of FIG. 8, however, illustrates a deliberately asymmetric placement of cavities 152 with respect to the edges 155–158 of sheet 151, thus avoiding energy losses due to repetitive edge-to-edge reflections.

Figure 9:
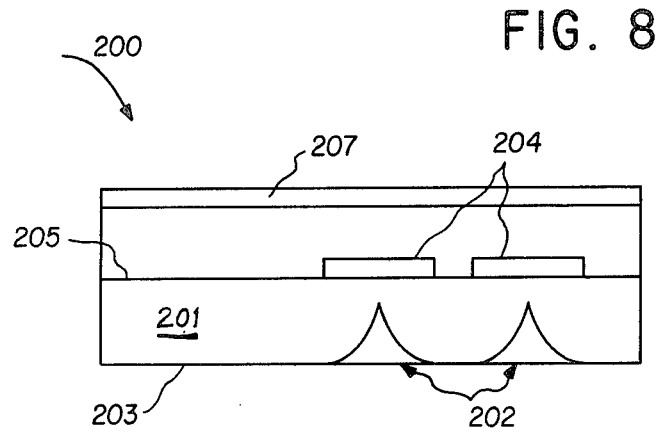
FIG. 9 is a device in accordance with yet another embodiment of this invention.

In yet another embodiment of this invention as seen in FIG. 9, a luminescent collector 200 comprising luminescent sheet 201 is provided with upwardly tapering cavities 202 on its bottom surface 203, corresponding photovoltaic cells 204 being carried on its upper surface 205. An environmental shield 207 may be positioned over the cells 204. The cavities 202 internally reflect edge concentrated light energy towards their respective cells 204 in the manner previously described for other embodiments.

Figure 10:
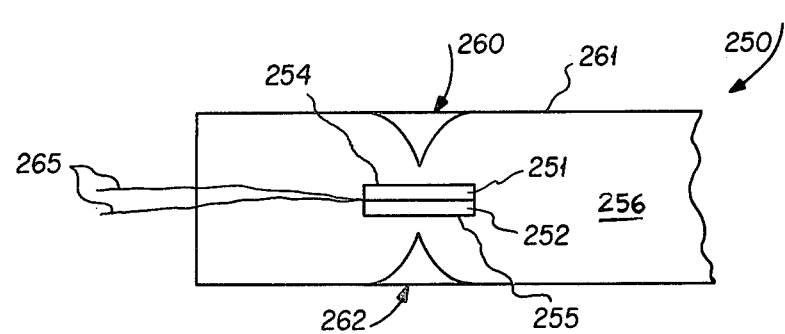
FIG. 10 is a device in accordance with a still further embodiment of this invention.

Finally, within the scope of this invention, as seen in FIG. 10, one may employ a luminescent collector 250 comprising luminescent sheet 256 within which are embedded pairs of photovoltaic cells such as cells 251 and 252 interconnected so that their respective energy-receiving surfaces 254 and 255 face in opposite directions. In the manner previously described, the wall of cavity 260 penetrating the upper sun light receiving surface 261 of the sheet 256 internally reflects concentrated light energy onto the surface 254 of the cell 251. In similar fashion, the wall of cavity 262 extending upwardly from the bottom surface 263 of the sheet 256 enhances internal light reflections onto the energy-receiving surface 255 of cell 252. Electrical leads 265 may be brought in between cells 251 and 252 and interconnected with an external load.

The luminescent sheets down in FIGS. 4 through 10 may be made of glass or polymeric material or other transparent material into which luminescent agents can be incorporated and dispersed by well known means, so long as the matrix material can be cast, molded, or cut into the indicated geometric shapes. The luminescent materials may include commercially available metals, oxides, or other metallic compounds whose characteristics are well known to the art. Such materials include, for example, neodymium oxide in a glass matrix or laser dyes from the coumarin or rhodamine families. Within the scope of this invention, the luminescent agents employed may either emit light directly or by way of cascading which approaches the desired energy range for specific types of photovoltaic cells.

Photovoltaic cells which may be used in the practice of this invention may include silicon, cadmium sulfide, gallium arsenide and many other semi-conductor materials well known to the art. The photovoltaic cells to be employed in this invention are not limited as to size or shape or configuration. Any suitable adherent means are acceptable for applying the cells to the large area surfaces of the various luminescent sheets. The interface between the luminescent sheets and the photovoltaic cells may be any optically clear material whose index of refraction is close to that of the luminescent sheet. It may also include an anti-reflective coating.

It may be desirable within the scope of this invention to roughen or add light diffusive material to the surfaces of the luminescent sheets on which the photovoltaic cells are carried in areas adjacent the interfaces with such cells, thus further enhancing internal reflection and retention of light energy.

It will be understood that, while the foregoing description and drawings are illustrative of preferred embodiments of this invention, those skilled in the art will have no difficulty in devising further modification in the configuration and arrangement of component parts without departing from the scope of this invention as set forth in the claims appended hereto.

I claim:

1. A luminescent solar collector comprising a luminescent sheet having first and second essentially parallel opposed large area surfaces separated by at least one thin edge face, said sheet being provided with at least one thin edge face, said sheet being provided with at least one cavity having an inwardly converging tapered annular side wall penetrating said first surface and extending therefrom at least partially through such sheet toward said second surface, said side wall being contoured so that light energy incident thereon within said sheet is internally reflected toward said second surface, and a photovoltaic means supported in fixed relation adjacent the convergent end of each said cavity so as to receive said reflected energy.

2. A device according to claim 1 wherein said photovoltaic means is coupled to said second surface.

3. A device according to claim 1 wherein said side wall of said cavity is a surface of revolution having an axis normal to said first and second surfaces.

4. A device according to claim 3 wherein said photovoltaic means is a photovoltaic cell concentric with the axis of said surface of revolution.

5. A device according to claim 3 wherein said cavity is tapered in the direction of said second surface.

6. A device according to claim 5 wherein the generator of said surface of revolution is a straight line.

7. A device according to claim 5 wherein the generator of said surface of revolution is a curve.

8. A device according to claim 7 wherein said surface of revolution is concave with respect to light incident thereon within said sheet.

9. A device according to claim 1 wherein said at least one cavity extends partially through said sheet.

10. A device according to claim 1 wherein said at least one cavity extends completely through such sheet.

11. A device according to claim 1 wherein said luminescent sheet has an irregular shape.

12. A device according to claim 1 wherein said sheet contains a plurality of said cavities in spaced apart relation, each of said cavities having a photovoltaic means positioned adjacent its convergent end.

13. A device according to claim 1 wherein said edge face is totally reflective.

14. A device according to claim 1 wherein said side wall of said at least one cavity is provided with external reflective means.

15. A device according to claim 1 wherein said photovoltaic means is embedded within said luminescent sheet.

16. A device according to claim 1 wherein said second surface is provided with diffuser means adjacent to the interface between said photovoltaic means and said sheet.

* * * * *